United States Patent
Yamamoto et al.

[11] Patent Number: 5,880,028
[45] Date of Patent: Mar. 9, 1999

[54] RIDGE WAVEGUIDE TYPE DISTRIBUTED FEEDBACK SEMICONDUCTOR LASER DEVICE AND METHOD FOR MANUFACTURING THE SAME

[75] Inventors: Kei Yamamoto; Takuma Hiramatsu; Koji Takahashi, all of Tenri; Mototaka Taneya, Nara, all of Japan

[73] Assignee: Sharp Kabushiki Kaisha, Osaka, Japan

[21] Appl. No.: 700,555

[22] Filed: Aug. 7, 1996

[30] Foreign Application Priority Data

Aug. 31, 1995 [JP] Japan .................................. 7-223363

[51] Int. Cl.⁶ .................................................. H01L 21/302
[52] U.S. Cl. .................................. 438/694; 438/31; 438/32
[58] Field of Search .................................. 438/31, 32, 29, 438/694

[56] References Cited

U.S. PATENT DOCUMENTS

| 4,704,720 | 11/1987 | Yamaguchi et al. | 372/96 |
| 4,782,035 | 11/1988 | Fujiwara | 437/129 |
| 5,140,149 | 8/1992 | Sakata et al. | 250/211 |
| 5,358,896 | 10/1994 | Komatsu et al. | 437/89 |

FOREIGN PATENT DOCUMENTS

| 60-247985 | 12/1985 | Japan . |
| 63-095687 | 4/1988 | Japan . |
| 05235463 | 9/1993 | Japan . |
| 08-139403 | 5/1996 | Japan . |

*Primary Examiner*—Benjamin Utech
*Assistant Examiner*—George Goudreau
*Attorney, Agent, or Firm*—Morrison & Foerster, LLP

[57] ABSTRACT

A ridge waveguide type distributed feedback semiconductor laser device includes a diffraction grating formed on a surface of a semiconductor wafer, a semiconductor layer formed on the diffraction grating, the semiconductor layer serving to alleviate the irregularity of the diffraction grating, and a stripe-like ridge having a cladding layer and a contact layer formed on the semiconductor layer. Also, a method for manufacturing the ridge waveguide type distributed feedback semiconductor laser device is disclosed.

10 Claims, 5 Drawing Sheets

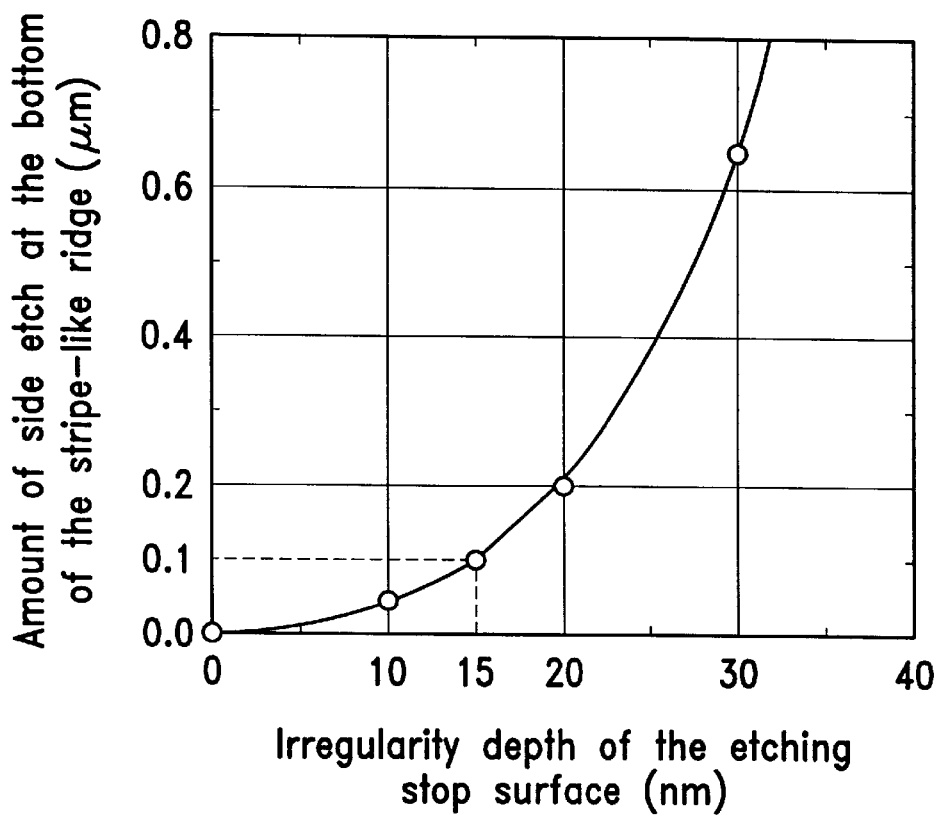
Fig. 3a
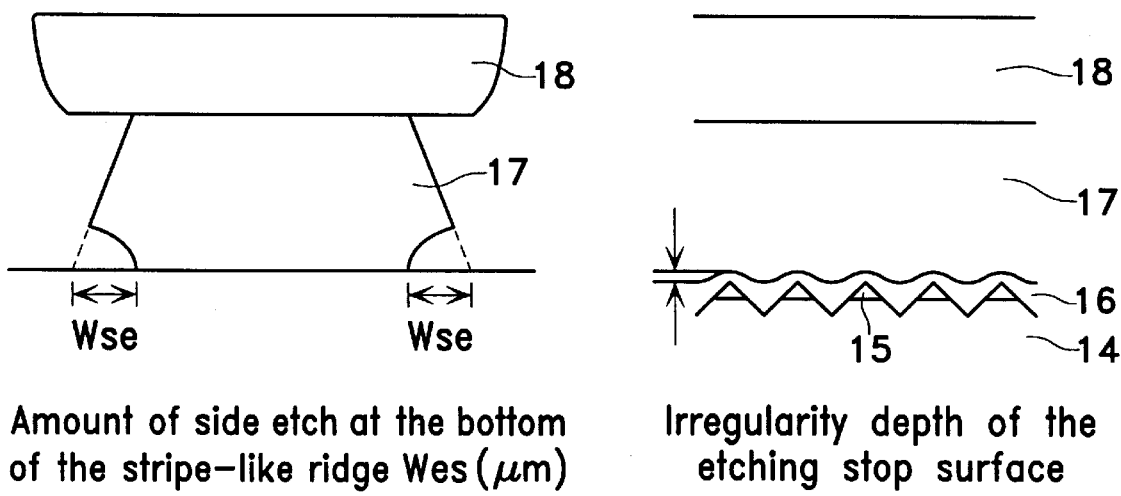
Amount of side etch at the bottom of the stripe-like ridge Wes (μm)
Fig. 3b
Irregularity depth of the etching stop surface
Fig. 3c

RIDGE WAVEGUIDE TYPE DISTRIBUTED FEEDBACK SEMICONDUCTOR LASER DEVICE AND METHOD FOR MANUFACTURING THE SAME

BACKGROUND OF THE INVENTION

1. Field of the Invention

The present invention relates to a ridge waveguide type distributed feedback semiconductor laser device and method for manufacturing the same.

2. Description of the Related Arts

A ridge waveguide type semiconductor laser device is a semiconductor laser device in which the stripe-like ridge makes it possible to confine electric currents and light and to accurately control the transverse mode of the laser operation. In a ridge waveguide type semiconductor laser device, the width of the stripe-like ridge (the ridge width) and the thickness between the active layer other than the stripe-like ridge region and the bottom surface of the ridge (the remaining thickness of ridge) determines how light is confined (or the broadening of light) and how electric currents are confined (or the broadening of electric currents), thus determining the device characteristics. Therefore, by accurately controlling the ridge width and the remaining thickness of the ridge, it is possible to increase the reproducibility of the device and to improve the manufacturing yield. By examining the electric current at threshold value of the laser device relative to the ridge width and the remaining thickness of the ridge, it has been found out that, in order to control the electric current at threshold value to be within ±5%, it is necessary to control the ridge width to be less than ±0.1 $\mu$m and the remaining thickness of the ridge to be less than ±0.01 $\mu$m.

Since the stripe-like ridge is formed by etching the portion other than the ridge, the etching depth determines the remaining thickness of the ridge. However, if the etching for forming the ridge is conducted by time control, it is difficult to control the remaining thickness of the ridge by etching, thereby decreasing the reproducibility of the characteristics. Therefore, a method is taken to stop the etching by using an etching stop surface and to accurately control the remaining thickness of the ridge by the etching, as is disclosed in Japanese Unexamined (Kokai) Patent Publication No. Sho 63(1988)-38279.

On the other hand, the distributed feedback semiconductor laser device (DFB-LD) is utilized as a coherent light source operating in a mono-axial mode and having a variable wavelength and a stable wavelength. There has been an increasing need of DFB-LD for use in optical measurement, optical communication/transmission, optical recording, laser beam printers, and the like. In DFB-LD, a diffraction grating is disposed on an active layer or on a guide layer. A distributed feedback of light is effected by the diffraction grating for operating the laser oscillation. By applying the above ridge waveguide to the DFB-LD, it is possible to accurately control the transverse mode of the laser operation. Therefore, DFB-LDs having a good reproducibility can be manufactured with good yield, so that the manufacturing method is highly valuable in industrial application.

Generally, an irregular (uneven) grating is used as a diffraction grating in DFB-LD. When a ridge is to be formed in DFB-LD, a grating is first formed, and a crystal growth is conducted on the grating. Subsequently, a ridge is formed by etching, as disclosed in Japanese Unexamined (Kokai) Patent Publication No. Hei 5(1993)-235463. FIG. 5 shows the structure of the distributed feedback semiconductor laser device thus manufactured.

The device shown in FIG. 5 is manufactured as follows. First, on an n-GaAs substrate 50, there are formed an n-$Al_{0.6}Ga_{0.4}As$ cladding layer 51, an $Al_{0.15}Ga_{0.85}As$ active layer 52, a p-$Al_{0.5}Ga_{0.5}As$ carrier barrier layer 53, a p-$Al_{0.25}Ga_{0.75}As$ guide layer 54, and a p-GaAs light absorbing layer 55 in this order by Metal Organic Chemical Vapor Deposition (MOCVD) method. Subsequently, a diffraction grating (optical waveguide stripe) having a pitch of 120 nm is carved on the p-GaAs light absorbing layer 55 by an ordinary two-beam interference exposure method and a wet etching technique. The diffraction grating has a depth of 30 nm. Afterwards, a p-$Al_{0.75}Ga_{0.25}As$ cladding layer 57 and a p-GaAs contact layer 58 are formed by growing under a condition of substrate temperature being 750° C., the V/III ratio in gas phase being 120, the growth speed being 25 nm/min, and the growth pressure being 76 Torr by using MOCVD method.

Then, a portion of the GaAs contact layer 58 other than the optical waveguide stripe is removed, and a portion of the cladding layer 57 is removed with use of an HF type etchant which selectively etches an Al-mixed crystal layer with a highly content of Al to form a stripe-like ridge having a width of 3 $\mu$m. Subsequently, electrodes are deposited on the upper portion of the ridge and on the rear surface of the substrate, followed by cleavage to complete the semiconductor laser device. In forming the ridge, the etching stops at the p-$Al_{0.25}Ga_{0.75}As$ guide layer 54/p-GaAs light absorbing layer 55 consisting of an Al-mixed crystal with a low content of Al which is hardly etched by the HF type etchant and having a grating formed therein.

In forming a ridge of DFB-LD, a grating is formed and a crystal growth is conducted on the grating, followed by forming a ridge, as shown above. However, in the conventional examples, the ridge is formed by selectively etching a portion of the p-$Al_{0.75}Ga_{0.25}As$ cladding layer 57 with the surface in which the grating is formed being used as an etching stop layer. However, when a crystal growth is conducted on an irregularity such as a grating, the growth proceeds from various surfaces of the irregularity, so that growing layers from various surfaces overlap with each other at the portion where one surface is connected to another, namely, at the recessed and projecting portions of the grating. These overlapped portions generate a strain. A strain applied to the growing layer decreases the crystallinity. The etching rate increases in a layer having lower crystallinity when compared with a continuously grown layer having the same composition and no strain. In the above conventional example, since the etching stop surface has a grating, the etching rate near the etching stop surface of the p-$Al_{0.75}Ga_{0.25}As$ cladding layer 57 is extremely greater than the continuously grown layer. Therefore, the vicinity of the etching stop layer is excessively etched, whereby a side etch is generated in the etching stop layer, making it impossible to obtain a desired stripe-like ridge. As a result of this, the reproducibility of the device decreases, thereby lowering the manufacturing yield.

SUMMARY OF THE INVENTION

The present invention provides a ridge waveguide type distributed feedback semiconductor laser device comprising a diffraction grating formed on a semiconductor wafer surface, a semiconductor layer formed on the diffraction grating, the semiconductor layer serving to alleviate the irregularity of the diffraction grating, and a stripe-like ridge having a cladding layer and a contact layer formed on the semiconductor layer.

The present invention also provides a method for forming a ridge waveguide type distributed feedback semiconductor laser device, comprising the steps of forming a diffraction grating on a surface of a semiconductor wafer, forming one semiconductor layer on the diffraction grating, the semiconductor layer serving to alleviate the irregularity of the diffraction grating, forming a cladding layer and a contact layer in this order on the semiconductor layer, and selectively etching the cladding layer and the contact layer to form a stripe-like ridge.

According to the ridge waveguide type distributed feedback semiconductor laser device of the present invention, if the migration of the material on the growing surface is large in conducting a crystal growth on the irregularity of the grating, the material tends to be concentrated in the recessed portion of the irregularity and the growth rate at the recessed portion increases, so that the recessed portion is gradually buried reflecting the irregularity of the grating, thereby flattening the growing surface. As the growing layer is flattened, the migration of the material in the growing surface is made uniform to provide a uniform growth rate, thereby alleviating the strain generated in the growing layer to achieve a good crystallinity of the growing layer. By using the above flattened surface as an etching stop layer in conducting a selective etching for forming a stripe-like ridge, the etching rate at the layer to be etched in the vicinity of the interface with the etching stop layer approaches the etching rate of a continuously grown layer having the same composition and no strain, so that the side etch at the bottom of the ridge is inhibited and the controllability of the ridge is improved.

BRIEF DESCRIPTION OF THE DRAWINGS

FIGS. 3(a), 3(b), and 3(c) are graphs showing a relationship between the irregularity depth of the etching stop surface and the amount of side etch at the bottom of the stripe-like ridge.

DETAILED DESCRIPTION OF THE PREFERRED EMBODIMENTS

Figure 1:
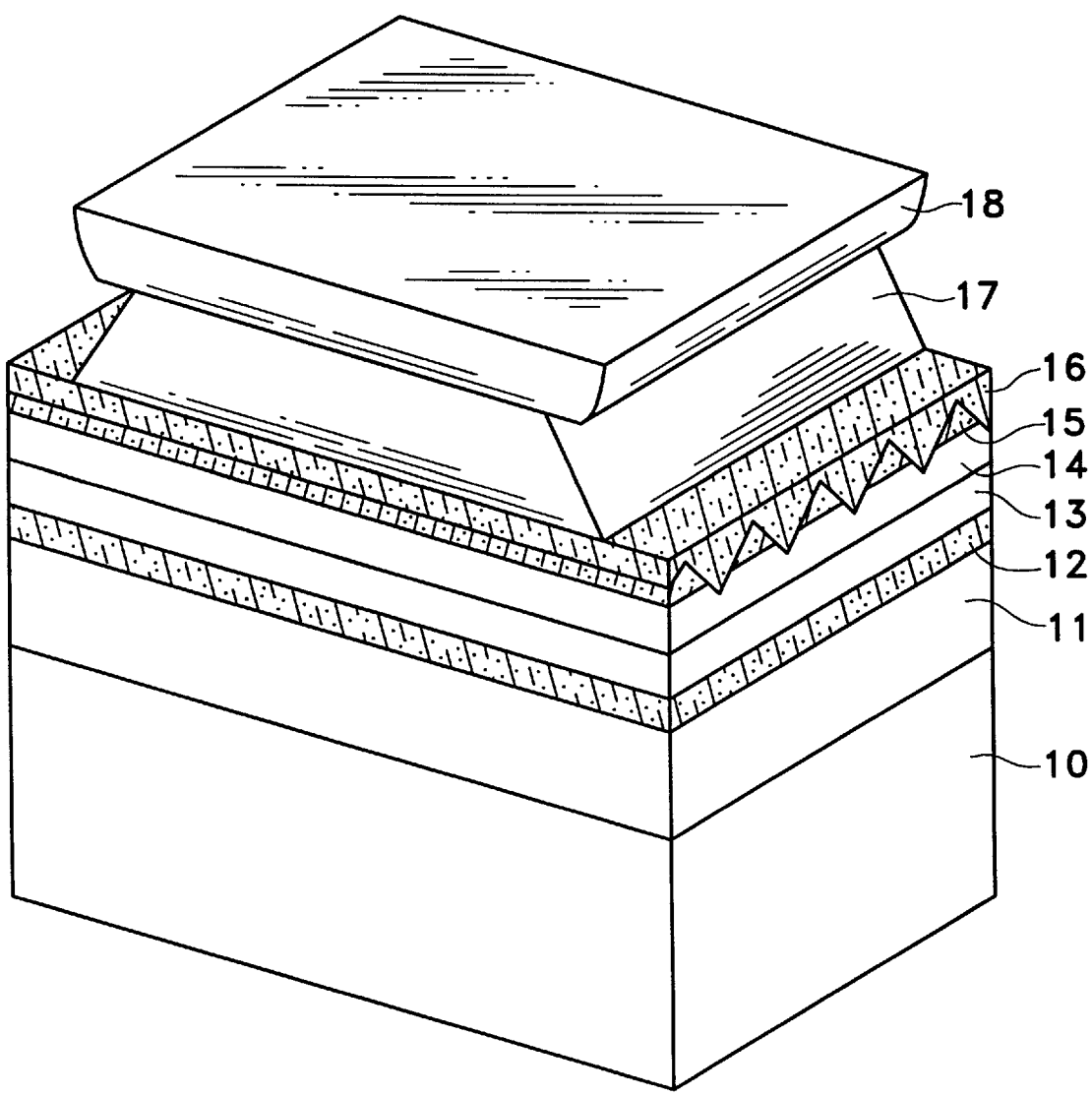
FIG. 1 is a view showing a first embodiment of the ridge waveguide type distributed feedback semiconductor laser device of the present invention.

The semiconductor wafer to be used in the present invention is not specifically limited, and it is possible to use any of the semiconductor wafers that can be used in a ridge waveguide type distributed semiconductor laser device. An example is a semiconductor wafer including a substrate, a first cladding layer, an active layer, a carrier barrier layer, a guide layer, and an optional light absorbing layer laminated in this order. The substrate to be used is not specifically limited and may be, for example, a gallium type substrate such as GaAs, GaP, and GaSb.

The material, the composition, and the thickness to be employed for the first cladding layer, the active layer, the carrier barrier layer, the guide layer, and the light absorbing layer to be formed on the substrate are determined depending on the substrate to be used and the efficiency of the desired device. For example, if GaAs is used as the substrate, it is possible to use a layer comprising $Al_xGa_{1-x}As$ ($0 \leq x \leq 1$) with the parameter x adjusted so as to have a predetermined composition.

The method for forming each of the above layers is not specifically limited, and a known method such as an MOCVD method, a Liquid Phase Epitaxy (LPE) method, or a Molecular Beam Epitaxy (MBE) method may be employed.

Further, a diffraction grating is formed on the semiconductor wafer. The shape of the diffraction grating according to the present invention is not specifically limited and any shape may be employed. Particularly, a grating shape has a pitch in the range of preferably 100 to 400 nm, more preferably 110 to 350 nm, and a depth in the range of preferably 20 to 200 nm, more preferably 20 to 50 nm. The diffraction grating is formed mainly in the light absorbing layer. However, a portion of the diffraction grating may be formed in the guide layer as well. If the light absorbing layer is not formed, the diffraction grating is formed in the guide layer. The diffraction grating may be formed by direct carving using a two beam interference exposure method that is generally used.

Next, a semiconductor layer for alleviating the irregularity of the diffraction grating is formed on the diffraction grating. The semiconductor layer has a surface shape such that a side etching is not generated on the semiconductor layer side of the cladding layer at the time of forming a stripe-like ridge. In other words, the semiconductor layer has a surface shape that substantially gives a resistance against side etching in the cladding layer adjacent the semiconductor layer when the stripe-like ridge is formed. Specifically, the upper surface of the semiconductor layer preferably has an irregularity of 15 nm or less. Here, the semiconductor layer includes at least one layer and may consist of a plurality of layers. The material to be used for the semiconductor layer may be any of those similar the ones used for the above first cladding layer and the like, and is suitably selected considering the lattice matching property with the guide layer or the light absorbing layer. Further, the composition of the semiconductor layer is preferably such that the semiconductor layer, at the time of being formed, gradually alleviates the irregularity of the diffraction grating. Specifically, a material which is capable of increasing the migration is suitably selected. For example, if the semiconductor layer consists of $Al_xGa_{1-x}As$, the parameter x may be a small value within the range of 0.14 to 0.45 preferably 0.14 to 0.35. If the parameter x is smaller than 0.14, it is not preferable because the semicondductor layer becomes absorptive of the oscillated laser beam and it is not possible to obtain a periodic absorption (gain) distribution, thereby leading to extremely bad laser device characteristics. On the other hand, if the parameter x is greater than 0.45, the migration of the corresponding material decreases, so that the semiconductor layer grows while reflecting the irregularity of the diffraction grating, hence not preferable. The thickness of the semiconductor layer is not specifically limited as long as it can flatten the irregularity of the diffraction grating, and may be preferably within the range of 5 to 500 nm, more preferably 30 to 100 nm from the apex of the projecting portion of the diffraction grating.

Even if the parameter x is large, it is possible to form a semiconductor layer alleviating the irregularity of the diffraction grating, if the growth condition of the above semiconductor layer is set so as to have a substrate temperature of 780° C. to 850° C., a V/III ratio in the gas phase of 70 to 20, a growth rate of 15 to 5 nm/min, and a growth pressure of 50 to 10 Torr.

Then, a stripe-like ridge made of a second cladding layer and a contact layer is formed on the above semiconductor layer.

Here, the material to be used for the second cladding layer and the contact layer may be any of those similar to the ones used for the above first cladding layer. The thickness of the second cladding layer and the contact layer each is preferably within the range of 0.5 to 2 μm and 0.1 to 2 μm, more preferably 0.8 to 1 μm and 0.5 to 1 μm, respectively. The method for forming each of the above layers is not specifically limited, and a known method such as an MOCVD method, an LPE method, or an MBE method may be employed.

Next, the stripe-like ridge is formed by selectively etching the second cladding layer and the contact layer. A desired number of stripe-like ridges may be formed. Examples of the etchant to be used include an HF type etchant.

Here, the substrate, the first cladding layer, the active layer, the carrier barrier layer, the guide layer, the light absorbing layer, the semiconductor layer, the second cladding layer, and the contact layer may have either n-type or p-type conductivity.

Subsequently, electrodes are formed on the rear surface of the semiconductor wafer and on the front surface of the contact layer, followed by cleavage to complete the laser device. The electrode to be used is not specifically limited, and any of the conventionally known ones may be used.

EXAMPLES

Example 1

FIG. 1 is a view showing a first embodiment of the ridge waveguide type distributed feedback semiconductor laser device of the present invention, and FIGS. 2(a), 2(b), 2(c), and 2(d) are views showing the steps of manufacturing the semiconductor laser device.

Figure 2A:
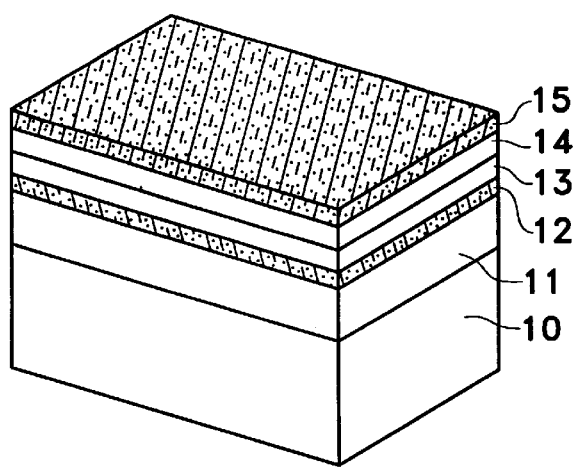
FIGS. 2(a), 2(b), 2(c), and 2(d) are views showing steps of manufacturing the first embodiment of the present invention.
Figure 2B:
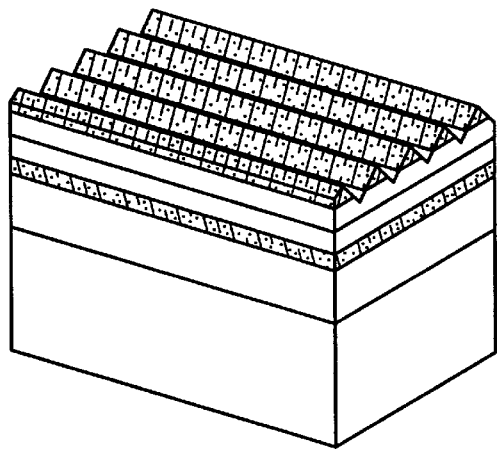
Figure 2C:
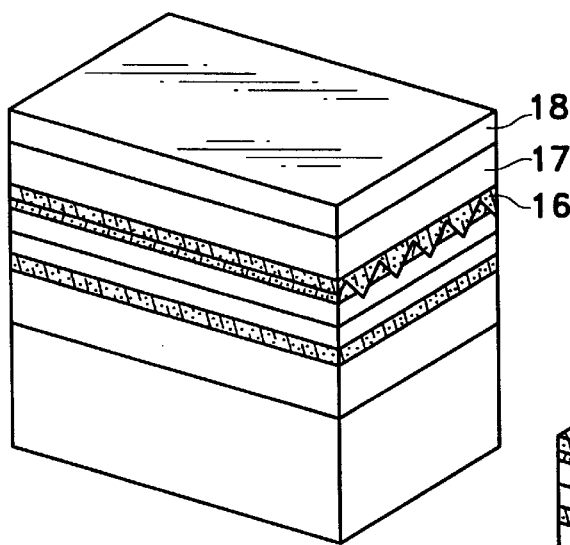

According to the first embodiment of the present invention, on an n-GaAs substrate 10 are formed an n-$Al_{0.6}Ga_{0.4}As$ cladding layer 11, an $Al_{0.15}Ga_{0.85}As$ active layer 12, a p-$Al_{0.5}Ga_{0.5}As$ carrier barrier layer 13, a p-$Al_{0.25}Ga_{0.75}As$ guide layer 14, and a p-GaAs light absorbing layer 15, in this order by an MOCVD method, as shown in FIG. 2(a). Subsequently, a diffraction grating having a pitch of 120 nm is carved on the uppermost layer of the growing layers by two-beam interference exposure method, as shown in FIG. 2(b). The diffraction grating consists of a grating having a depth of 30 nm. Thereafter, a p-$Al_{0.25}Ga_{0.75}As$ guide burying layer (semiconductor layer) 16 having a thickness of 20 nm from the projecting portion (the ridge portion) of the grating, a p-$Al_{0.75}Ga_{0.25}As$ cladding layer 17, and a p-GaAs contact layer 18 are formed by crystal growth again using MOCVD method, as shown in FIG. 2(c). At this stage, the p-$Al_{0.25}Ga_{0.75}As$ guide burying layer 16 buries the grating to make an approximately flat surface alleviating the irregularity of the grating, so that the layers growing thereafter become flat as well.

Figure 2D:
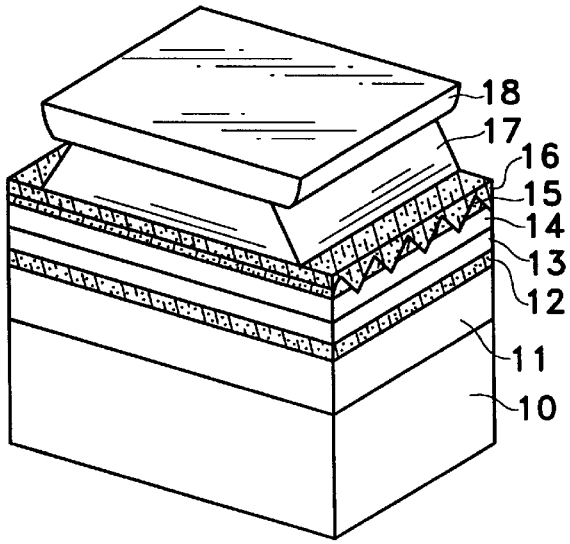

Subsequently, after removing a portion of the GaAs contact layer other than the region where the optical waveguide stripe is to be formed, a portion of the cladding layer is removed with an HF-type etchant which selectively etches an Al-mixed crystal with a high content of Al layer, thereby forming a stripe-like ridge having a width of 3 μm as shown in FIG. 2(d). At this stage, the etching stops at the p-$Al_{0.25}Ga_{0.75}As$ guide burying layer 16 which has buried the irregularity of the grating by the second crystal growth. Thereafter, electrodes are deposited on the upper portion of the ridge and on the rear surface of the substrate, followed by cleavage to complete the semiconductor laser element.

Under the crystal growth condition of this example (growth temperature being 750° C., V/III=120, GR=25 nm/min, growth pressure being 76 Torr), an Al-mixed crystal layer (AlGaAs layer) with a high content of Al involves small migration of the material on the growing surface, and the crystal grows uniformly regardless of the shapes of the growing surface, so that the growth proceeds while reflecting the original shape of the growing surface. However, an Al-mixed crystal layer (AlGaAs layer) with a low content of Al involves large migration of the material on the growing surface, so that, if the growing surface has irregularity, the material is concentrated in the recessed portion (the gorge portion) of the grating on the growth surface, and the growth rate at the recessed portion increases, so that the recessed portion is gradually buried reflecting the irregularity of the grating, thereby flattening the growing surface. Specifically, on the grating having a depth of about 30 nm was deposited the p-$Al_{0.25}Ga_{0.75}As$ guide burying layer 16 having a thickness of 20 nm from the projecting portion of the grating. This layer buried the irregularity of the grating starting from its recessed portion (the gorge portion), thereby gradually alleviating the depth of irregularity of the grating, so that the upper surface of the p-$Al_{0.25}Ga_{0.75}As$ guide burying layer 16 was approximately flat. This made the migration of the material in the growing surface on the p-$Al_{0.25}Ga_{0.75}As$ guide burying layer 16 uniform to provide a uniform growth rate, so that growing layers from various surfaces reflecting the original irregularity of the grating did not overlap with each other, thereby alleviating the strain generated in the growing layer to achieve a good crystallinity. The etching rate of the p-$Al_{0.75}Ga_{0.25}As$ cladding layer 17 with respect to the hydrofluoric acid type etchant near the interface with the p-$Al_{0.25}Ga_{0.75}As$ guide burying layer 16 was approximately the same as the etching rate of a continuously grown $Al_{0.75}Ga_{0.25}As$ layer. Therefore, when the p-$Al_{0.75}Ga_{0.25}As$ cladding layer 17 was selectively etched and the etching was stopped at the p-$Al_{0.25}Ga_{0.75}As$ guide burying layer 16 at the time of forming the stripe-like ridge, a desired ridge was obtained without a side etch generated at the bottom of the ridge.

With the controllability of the stripe-like ridge being improved, the light and the electric current can be confined as designed for each device, thereby improving the reproducibility of the device to increase the manufacturing yield.

Here, the depth of irregularity at the upper surface of the p-$Al_{0.25}Ga_{0.75}As$ guide burying layer 16 reflecting the original irregularity of the grating was measured by varying the layer thickness of the p-$Al_{0.25}Ga_{0.75}As$ guide burying layer 16 for burying the grating to alleviate the depth of irregularity of the grating. The relationship between the depth of irregularity (FIG. 3(c)) of the etching stop layer at the time of forming a ridge and the amount of side etch (FIG. 3(b)) at the bottom of the ridge at the time of selective etching was examined. The result shows that, as illustrated in FIG. 3(a), if the depth of irregularity is less than 15 nm, the amount of side etch is less than 0.1 μm, so that it is possible to control the ridge width to an accuracy of ±0.1 μm, as described above. Therefore, by reducing the depth of irregularity at the surface of the etching stop layer to be less than 15 nm, it was possible to improve the reproducibility of the characteristics of the device to increase the manufacturing yield.

Example 2

Figure 4:
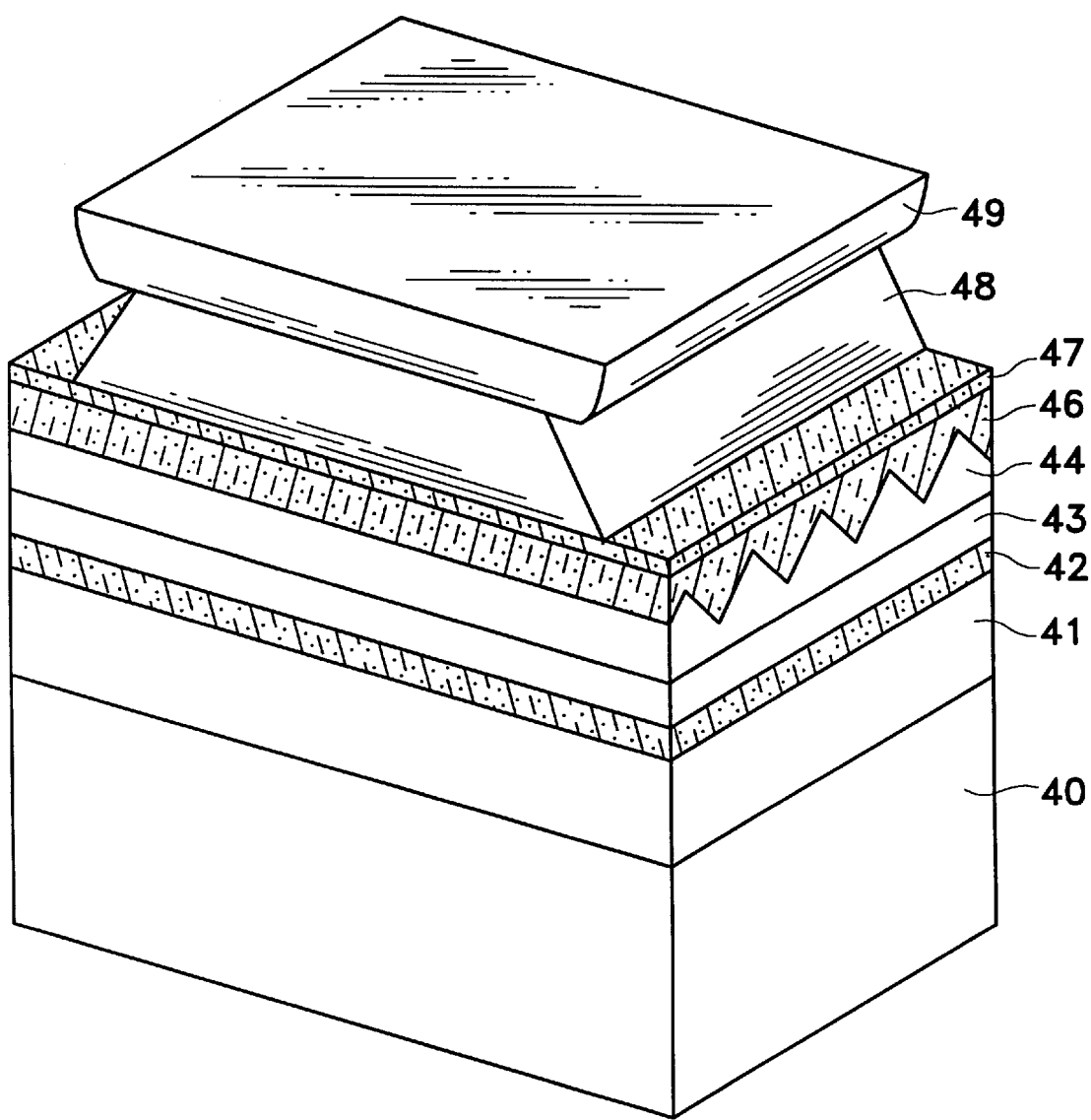
FIG. 4 is a view showing a second embodiment of the ridge waveguide type distributed feedback semiconductor laser device of the present invention.
Figure 5:
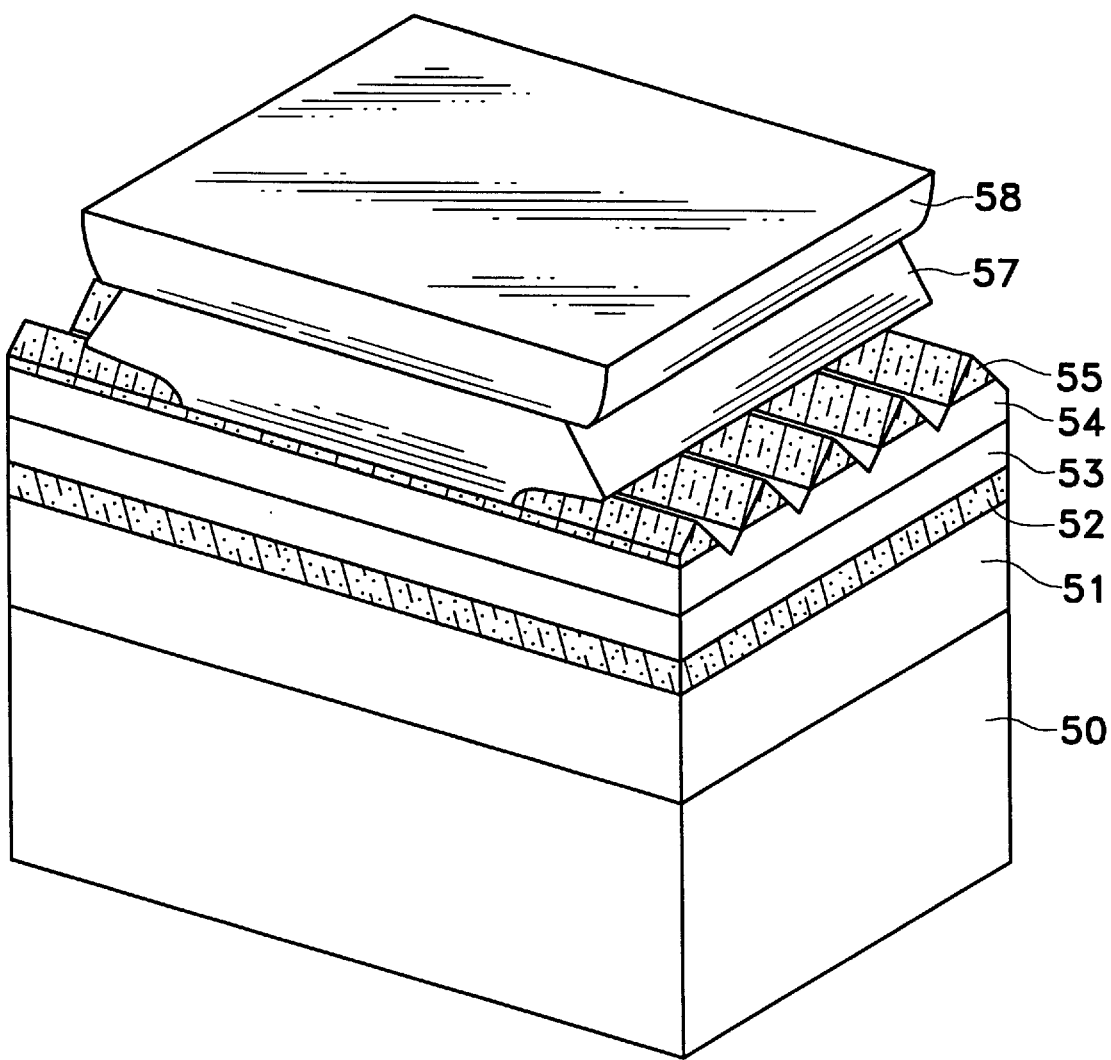
FIG. 5 is a view showing a conventional ridge waveguide type distributed feedback semiconductor laser device.

FIG. 4 is a view showing a second embodiment of the ridge waveguide type distributed feedback semiconductor laser device of the present invention. In this example, on a p-GaAs substrate 40 are formed a p-$Al_{0.5}Ga_{0.5}As$ cladding layer 41, an $Al_{0.15}Ga_{0.85}As$ active layer 42, an n-$Al_{0.5}Ga_{0.5}As$ carrier barrier layer 43, and an n-$Al_{0.25}Ga_{0.75}As$ guide layer 44 in this order by a MOCVD method. Subsequently, a diffraction grating having a pitch of 360 nm is carved on the uppermost layer of the growing layers by a two-beam interference exposure method. The diffraction grating consists of a grating having a depth of 100 nm.

Thereafter, an n-$Al_{0.5}Ga_{0.5}As$ burying layer 46 having a thickness of 100 nm from the projecting portion of the grating, an n-$Al_{0.7}Ga_{0.3}As$ etching stop layer 47, an n-$Al_{0.25}Ga_{0.75}As$ layer 48, and an n-GaAs contact layer 49 are formed in this order by crystal growth again using an MOCVD method. At this stage, the n-$Al_{0.5}Ga_{0.5}As$ burying layer 46 buries the grating to make an approximately flat surface alleviating the irregularity of the grating, so that the layers growing thereafter become flat as well.

Subsequently, a portion of the n-$Al_{0.25}Ga_{0.75}As$ layer 48 other than the region where the optical waveguide stripe is to be formed is removed with an ammonia-type etchant which selectively etches an Al-mixed crystal layer with a low content of Al, thereby forming a stripe-like ridge having a width of 3 μm. At this stage, the etching stopped at the n-$Al_{0.7}Ga_{0.3}As$ etching stop layer 47 which buried the irregularity of the grating to be flat by the second crystal growth. Thereafter, electrodes are deposited on the upper portion of the ridge and on the rear surface of the substrate, followed by cleavage to complete the semiconductor laser device.

In this example, the n-$Al_{0.5}Ga_{0.5}As$ burying layer 46 was grown by an Atomic Layer Epitaxy (ALE) method which supplied trimethylgallium (TMGa), trimethylaluminum (TMAl), and arsine ($AsH_3$) alternatingly. Here, an Al-mixed crystal layer (AlGaAs layer) with a high content of Al also involves large migration of the material on the growing surface, so that the material is concentrated in the recessed portion (the gorge portion) of the irregularity on the growth surface, and the growth rate at the recessed portion increases, so that the n-$Al_{0.5}Ga_{0.5}As$ burying layer 46 is gradually flattened while reflecting the original irregularity, thereby achieving an approximately flat growing surface on its upper surface.

The n-$Al_{0.7}Ga_{0.3}As$ etching stop layer 47 on the n-$Al_{0.5}Ga_{0.5}As$ burying layer 46 also had an approximately flat shape. This made the migration of the material in the growing surface on the n-$Al_{0.7}Ga_{0.3}As$ etching stop layer 47 uniform to obtain a uniform growth rate in the surface, so that growing layers from various surfaces reflecting the original irregularity of the grating did not overlap with each other, thereby alleviating the strain generated in the growing layer to achieve a good crystallinity. The etching rate of the n-$Al_{0.25}Ga_{0.75}As$ layer 48 with respect to the ammonia-type etchant near the interface with the n-$Al_{0.7}Ga_{0.3}As$ etching stop layer 47 was approximately the same as the etching rate of a continuously grown $Al_{0.25}Ga_{0.75}As$ layer. Therefore, since the n-$Al_{0.25}Ga_{0.75}As$ layer 48 was selectively etched and the etching was stopped at the n-$Al_{0.7}Ga_{0.3}As$ etching stop layer 47 at the time of forming the stripe-like ridge, a desired ridge was obtained without a side etch generated at the bottom of the ridge.

With the controllability of the stripe-like ridge being thus improved, the light and the electric current can be confined as designed for each device, thereby improving the reproducibility of the device to increase the manufacturing yield.

On the other hand, even when a crystal growth was conducted by an ordinary MOCVD method under a crystal growth condition of the n-$Al_{0.5}Ga_{0.5}As$ burying layer 46 with the growth substrate temperature being in a little higher range of 780° C. to 850° C., the V/III ratio in gas phase being in a little lower range of 70 to 20, the growth rate being lowered to be in a range of 15 to 5 nm/min, and the growth pressure being lowered to be in a range of 50 to 10 Torr in preparing a device having a similar structure, the growing surface of the n-$Al_{0.5}Ga_{0.5}As$ burying layer 46 grown on a grating having a pitch of 360 nm and a depth of 100 nm was approximately flat and a good result was obtained in both the ridge shape and the device properties.

Although only the MOCVD method was explained here, a crystal growth conducted by employing other methods such as LPE method or MBE method gave similar results when a growth condition to increase the migration was selected, alleviating the irregularity of the surface to obtain an approximately flat buried surface.

Also, the relationship between the depth of irregularity on the upper surface of the n-$Al_{0.7}Ga_{0.3}As$ etching stop layer 47 and the amount of side etch at the bottom of the ridge in conducting a selective etching was similar to the one shown in FIG. 3 obtained by the first embodiment of the present invention. Here, the upper surface of the n-$Al_{0.7}Ga_{0.3}As$ etching stop layer 47 serving as an etching stop layer at the time of forming the ridge reflects the irregularity of the grating. When the irregularity depth was less than 15 nm, the amount of side etch was less than 0.1 μm, so that it was possible to control the ridge width to an accuracy of ±0.1 μm, as previously described. Therefore, by allowing the irregular depth of the surface of the etching stop layer to be less than 15 nm, it was possible to increase the reproducibility of the device characteristics and to improve the manufacturing yield.

Thus, by burying the irregularity of the grating to obtain an approximately flat crystal growth surface in a ridge waveguide type distributed feedback semiconductor laser, it is possible to alleviate the strain of the growing layer and to improve the crystallinity of the growing layer. Therefore, by using the above approximately flattened surface as an etching stop layer in conducting a selective etching for forming a stripe-like ridge, the etching rate of the layer to be etched on the approximately flat surface approaches the etching rate of a continuously grown layer having the same composition and no strain even in the vicinity of the interface with the etching stop layer, so that the side etch at the bottom of the ridge is inhibited and the controllability of the ridge is improved.

Thus, the structure in which the etching stop surface made approximately flat coincides with the bottom surface of the stripe-like ridge in DFB-LD having a grating makes it possible to obtain a ridge without a side etch at the bottom of the ridge and to control the ridge width and the remaining thickness of the ridge with good reproducibility, making it possible to confine light and electric current as designed in the same manner for each device, thereby increasing the reproducibility of the device and improving the manufacturing yield.

Also, by allowing the irregularity depth of the etching stop layer reflecting the irregular shape of the grating to be less than 15 nm in forming a stripe-like ridge, the amount of side etch at the bottom of the ridge is reduced to a degree which does not affect the variation of the characteristics of the device by variation in the ridge width, thereby increasing the reproducibility of the device and improving the manufacturing yield.

What we claim is:

1. A method for forming a ridge waveguide type distributed feedback semiconductor laser device, comprising the steps of:

forming a diffraction grating over a surface of a semiconductor wafer;

forming one semiconductor layer over the diffraction grating, the semiconductor layer serving to alleviate the irregularity of the diffraction grating;

forming a cladding layer and a contact layer in this order on the semiconductor layer; and selectively etching the cladding layer and the contact layer to form a stripe-like ridge.

2. A method according to claim 1, in which the semiconductor wafer comprises a substrate, a first cladding layer, an active layer, a carrier barrier layer, a guide layer and a light absorbing layer, and the diffraction grating is formed in the light absorbing layer.

3. A method according to claim 1, in which the semiconductor wafer comprises a substrate, a first cladding layer, an active layer, a carrier barrier layer and a guide layer, and the diffraction grating is formed in the guide layer.

4. A method according to claim 1, in which the semiconductor layer has a surface shape that substantially gives a resistance against side etching in the cladding layer adjacent the semiconductor layer when the stripelike ridge is formed.

5. A method according to claim 1, in which the semiconductor layer has an irregularity difference of 15 nm or less at the upper surface thereof.

6. A method according to claim 1, in which the semiconductor layer and the semiconductor wafer each comprise a material represented by $Al_xGa_{1-x}As$ ($0 \leq x \leq 1$).

7. A method according to claim 1, in which the semiconductor layer comprises an $Al_xGa_{1-x}As$ layer ($0.14 \leq x \leq 0.45$).

8. A method according to claim 1, in which the semiconductor layer has a thickness within a range of 5 to 500 nm as measured from an apex of a projecting portion of the diffraction grating.

9. A method according to claim 1 wherein the semiconductor layer is on the grating.

10. A method according to claim 1 wherein the semiconductor wafer further comprise an active layer.

* * * * *

UNITED STATES PATENT AND TRADEMARK OFFICE
CERTIFICATE OF CORRECTION

PATENT NO. : 5,880,028
DATED : March 9, 1999
INVENTOR(S) : Kei Yamamoto et al.

It is certified that error appears in the above-identified patent and that said Letters Patent is hereby corrected as shown below:

In column 2, line 13, after "750°C" please delete the period;
In column 4, line 65, after "850°C" please delete the period;
In column 8, line 5, after '780°C" please delete the period; and
In column 8, line 5, after "850°C" please delete the period.

Signed and Sealed this

Fifteenth Day of August, 2000

Attest:

Q. TODD DICKINSON

Attesting Officer

Director of Patents and Trademarks